(12) United States Patent
Bowers et al.

(10) Patent No.: US 12,086,949 B2
(45) Date of Patent: Sep. 10, 2024

(54) DIGITAL POSITIONING HANDLES FOR A DESIGN PLATFORM

(71) Applicant: Unity Building Technologies, Inc., Walpole, NH (US)

(72) Inventors: W. Taisto Bowers, Havelock, NC (US); Tedd Benson, Alstead, NH (US)

(73) Assignee: Seamless, LLC, Walpole, NH (US)

( * ) Notice: Subject to any disclaimer, the term of this patent is extended or adjusted under 35 U.S.C. 154(b) by 0 days.

(21) Appl. No.: 17/917,690

(22) PCT Filed: Feb. 17, 2022

(86) PCT No.: PCT/US2022/016763
§ 371 (c)(1),
(2) Date: Oct. 7, 2022

(87) PCT Pub. No.: WO2022/178104
PCT Pub. Date: Aug. 25, 2022

(65) Prior Publication Data
US 2023/0401803 A1    Dec. 14, 2023

Related U.S. Application Data

(60) Provisional application No. 63/150,795, filed on Feb. 18, 2021.

(51) Int. Cl.
*G06T 19/20*    (2011.01)
*G06F 30/13*    (2020.01)

(52) U.S. Cl.
CPC .............. *G06T 19/20* (2013.01); *G06F 30/13* (2020.01); *G06T 2219/2004* (2013.01); *G06T 2219/2016* (2013.01)

(58) Field of Classification Search
None
See application file for complete search history.

(56) References Cited

U.S. PATENT DOCUMENTS

2002/0035451 A1    3/2002    Rothermel
2005/0071796 A1    3/2005    Moyer
(Continued)

OTHER PUBLICATIONS

International Search Report for International Application No. PCT/US2022/016763; International Filing Date Feb. 17, 2022; Date of Mailing May 5, 2022; 2 pages.
(Continued)

*Primary Examiner* — Robert J Craddock
(74) *Attorney, Agent, or Firm* — CANTOR COLBURN LLP

(57) ABSTRACT

An embodiment of a method of positioning features in a digital design space includes receiving a request from a user to place a first feature in the design space, and based on the request, placing the first feature in the design space, and coupling a first positioning handle to the first feature in the design space. The first positioning handle is graphically represented in the design space and manipulatable by the user, the first positioning handle has a fixed position and fixed orientation relative to the first feature, and the first positioning handle includes a first face surface and defines a first vector. The method also includes moving the first feature into a pre-determined position and orientation relative to a target feature in the design space by mating the first positioning handle to a target positioning handle coupled to the target feature.

20 Claims, 10 Drawing Sheets

(56) References Cited

U.S. PATENT DOCUMENTS

2005/0204312 A1    9/2005  Rosel
2014/0025349 A1    1/2014  Diguet et al.
2016/0275209 A1    9/2016  Kelly et al.

OTHER PUBLICATIONS

Naomi, "Cricut Basics—How To Lock Image Positions in Design Space by How To Heat Press", Oct. 10, 2019, 23 pages.
Written Opinion for International Application No. PCT/US2022/016763; International Filing Date Feb. 17, 2022; Date of Mailing May 5, 2022; 4 pages.

DIGITAL POSITIONING HANDLES FOR A DESIGN PLATFORM

CROSS-REFERENCE TO RELATED APPLICATION

This application is a National Stage application of PCT/US2022/016763, filed Feb. 17, 2022, which claims the benefit of U.S. Provisional Patent Application No. 63/150,795, filed Feb. 18, 2021, both of which are incorporated by reference in their entirety herein.

BACKGROUND

The subject matter described herein relates in general to digital design systems such as computer-aided design systems, and in particular to processes related to positioning features within a design space.

SUMMARY

An embodiment of a method of positioning features in a digital design space includes receiving a request from a user to place a first feature in the design space, and based on the request, placing the first feature in the design space, and coupling a first positioning handle to the first feature in the design space. The first positioning handle is graphically represented in the design space and manipulatable by the user, the first positioning handle has a fixed position and fixed orientation relative to the first feature, and the first positioning handle includes a first face surface and defines a first vector. The method also includes moving the first feature into a pre-determined position and orientation relative to a target feature in the design space by mating the first positioning handle to a target positioning handle coupled to the target feature.

An embodiment of a system for positioning objects in a digital design space includes one or more processors for executing computer readable instructions, the computer readable instructions controlling the one or more processors to perform operations. The operations include receiving a request from a user to place a first feature in the design space, and based on the request, placing the first feature in the design space, and coupling a first positioning handle to the first feature in the design space. The first positioning handle is graphically represented in the design space and manipulatable by the user, the first positioning handle has a fixed position and fixed orientation relative to the first feature, and the first positioning handle includes a first face surface and defines a first vector. The operations also include moving the first feature into a pre-determined position and orientation relative to a target feature in the design space by mating the first positioning handle to a target positioning handle coupled to the target feature.

DETAILED DESCRIPTION

Figure 1:
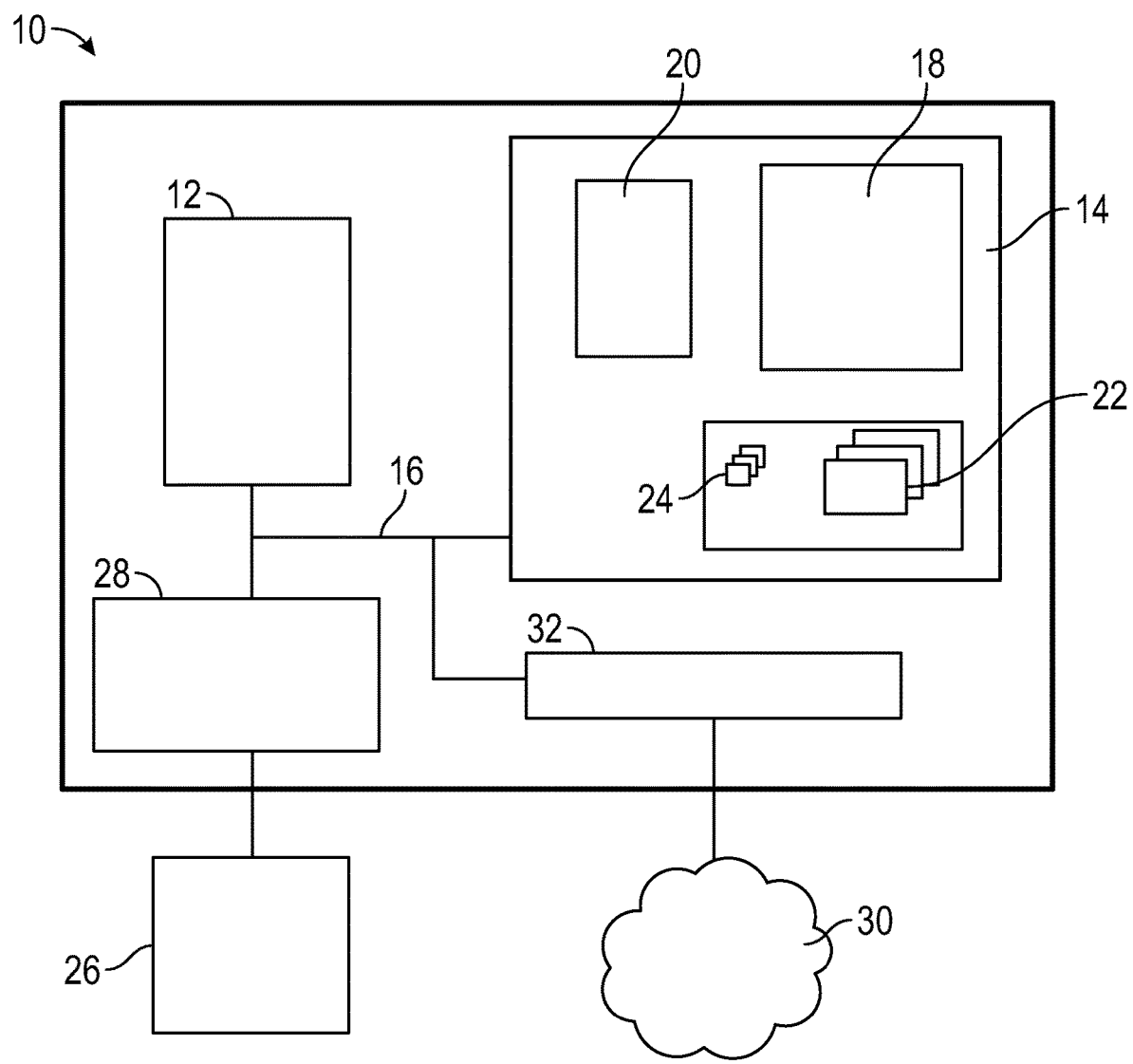
FIG. 1 depicts a computer system having functions related to computer-aided design (CAD), in accordance with one or more embodiments of the present invention.

One or more embodiments of the present invention relate to positioning of objects in a computer-aided design (CAD) system or other digital design system.

Devices, systems and methods are provided for positioning objects in a computer-aided design (CAD) design space. An embodiment of a CAD system is configured to generate a two-dimensional or three-dimensional digital structure that can be used to connect or align features and/or vector spaces in a CAD design space. The structure is configured as a positioning "handle" that has a fixed position relative to a point (e.g., an origin point) in a vector space and has a fixed orientation relative to the vector space, i.e., is "coupled" to the vector space. A "vector space" is a space within the CAD design space that is defined by a set of vectors. The positioning handle is coupled to the vector space so that the positioning handle is in a fixed position and orientation relative to the vector space. The positioning handle may also have a fixed scale relative to the vector space. Thus, any type of linear transformation of the positioning handle (e.g., translation, rotation, scaling, reflection) results in an equivalent linear transformation of the vector space.

If a CAD feature, such as a CAD object or model, is defined within the vector space, a linear transformation of the object handle and the vector space results in an equivalent linear transformation of the CAD feature. Thus, a positioning handle coupled to the vector space is also coupled to the CAD object or model. In the following, when a positioning handle is described as being "coupled" to a CAD object or model, it is to be understood that the positioning handle is also coupled to a vector space in which the object or model is located.

In the following, the positioning handle is coupled to a CAD object; however, it is noted that the positioning handle can be coupled to any feature or geometric object that can be represented in a design space (e.g., models, grids, volumes, etc.).

Each of a plurality of vector spaces may be provided with a respective positioning handle. Each positioning handle is coupled to a vector space (i.e., in a fixed position and orientation with respect to the vector space) so that connection rules are enforced. For example, when a positioning handle coupled to a first vector space is mated with another positioning handle (a "target handle") coupled to a target vector space, the first vector spaces and the target vector spaces are connected or aligned via a linear transformation according to pre-determined connection rules. A handle can be coupled to an object in a vector space, for example, by adding data to an object file (e.g., in file metadata or within the object) to represent the handle (position and vector data) and specify a fixed relationship between the handle and the object.

Each positioning handle may be a three-dimensional object. In one embodiment, each positioning handle is configured as a mesh object formed by a set (one or more) of triangular surfaces, such as a tetrahedron. The positioning handle in this embodiment includes a face surface and at least one vector. For example, the positioning handle includes a positioning vector extending from the face surface (e.g., orthogonal to the face surface, or at another angle relative to the face surface), and an orientation vector. Two positioning handles can be mated (to align respective objects according to connection rules) by making their respective facing surfaces coincident and by aligning their respective vectors. A first positioning handle may be mated to a target positioning handle by reading the location, orientation and/or scale of the positioning handles and extracting a linear transformation that brings the first positioning handle into scale alignment and mirror alignment with the target positioning handle.

In one embodiment, the CAD system stores data for a positioning handle (e.g., as metadata in an object file) for each of a plurality of stored objects. In this way, each object (and corresponding vector space) has an associated positioning handle. An object may have more than one positioning handle, e.g., so that multiple other objects can be aligned with the object.

To align two objects in a prescribed manner, the respective handles (and their objects) can be selected by a user, and the CAD system can automatically align the objects so that the handles are mated together. As described herein, objects are "aligned" when the objects are maintained in a fixed position and orientation relative to each other.

Handles can be used to mate components and models, air volumes, grids and other features using various connection or alignment rules. For example, in the context of a CAD system configured to facilitate the design of houses or other structures, a handle can be graphically and computationally coupled to structure components or models so that the components or models can be aligned to one another according to pre-selected connection rules. For example, handles can be used to make floor plane connections according to grid rules (e.g., edge or center line), make window and door connections to walls according to rules such as required head height, pre-selected center lines and grid rules. As described herein, a handle is "coupled" to an object when the handle is in a fixed position and orientation relative to the object (defined, e.g., by including position and orientation data describing the handle in an object file). A handle may be coupled to an object with or without actually touching the object, and can thus be at any desired distance from the object.

Embodiments described herein provide a number of advantages. The positioning handles provide an intuitive and easy way for a user to connect or align various objects and features while ensuring that such features are aligned based on pre-determined rules. This is useful, for example, in CAD systems configured for specialized usage, such as designing houses, buildings and other structures. For example, handles can be digitally affixed to objects and models that represent parts of a designed structure, allowing the user to easily assemble and configure components and systems of a structure, and to easily make design changes. In this way, structures can be designed by users having varying levels of expertise in building design and construction.

FIG. 1 illustrates aspects of an embodiment of a computer system 10 that can perform various aspects of embodiments described herein. The computer system may be or include a user device (e.g., personal computer, laptop, mobile device, etc.), a server or any other suitable device or system. In one embodiment, the computer system 10 is configured to execute aspects of a computer-aided design (CAD) software architecture. The computer system 10 is not limited to use with a CAD program, as it can be used with any application, software or system that generates and manipulates three-dimensional objects. For example, embodiments described herein can be used in game development and execution of games.

The computer system 10 may be part of (e.g., as a node) or in communication with a cloud computing architecture, as discussed in more detail with reference to FIGS. 13 and 14. For example, the system 10 may be a client computer that provides a user interface, and that is connected to a server or servers that performs various processing tasks associated with methods and embodiments described herein.

The computer system 10 includes at least one processing device 12, which generally includes one or more processors for performing aspects of methods described herein. The processing device 12 may be configured to perform functions that include generating and displaying a digital CAD environment (e.g., grid), performing design functions (e.g., creating and manipulating CAD objects based on user input), and storing and retrieving data such as CAD object files.

Components of the computer system 10 include the processing device 12 (such as one or more processors or processing units), a system memory 14, and a bus 16 that couples various system components including the system memory 14 to the processing device 12. The system memory 14 may include a variety of computer system readable media. Such media can be any available media that is accessible by the processing device 12, and includes both volatile and non-volatile media, removable and non-removable media.

For example, the system memory 14 includes a non-volatile memory 18 such as a hard drive, and may also include a volatile memory 20, such as random access memory (RAM) and/or cache memory. The computer system 10 can further include other removable/non-removable and volatile/non-volatile computer system storage media.

The system memory 14 can include at least one program product 22 having a set (at least one) of program modules that are configured to carry out functions of the embodiments described herein. For example, the system memory 14 stores various program modules that generally carry out the functions and/or methodologies of embodiments described herein. In one embodiment, the program product 22 includes a CAD software architecture or components thereof. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

Various data structures can be stored by the computer system 10 and/or are accessible by the computer system 10. For example, the system memory 14 can store CAD object files 24 for pre-configured CAD objects. In addition, or alternatively, CAD object files 24 and/or other data (e.g., user information) can be stored in a remote location such as a database.

The processing device 12 can also communicate with one or more external devices 26. Communication with various devices can occur via Input/Output (I/O) interfaces 28.

The processing device 12 may also communicate with one or more networks 30 such as a local area network (LAN), a general wide area network (WAN), and/or a public network (e.g., the Internet) via a network adapter 32. In some embodiments, there may be multiple networks, some of which (or parts of networks) may be virtualized. It should be understood that although not shown, other hardware and/or software components could be used in conjunction with the computer system 30. Examples include, but are not limited to: microcode, device drivers, redundant processing units, external disk drive arrays, RAID systems, and data archival storage systems.

Figure 2:
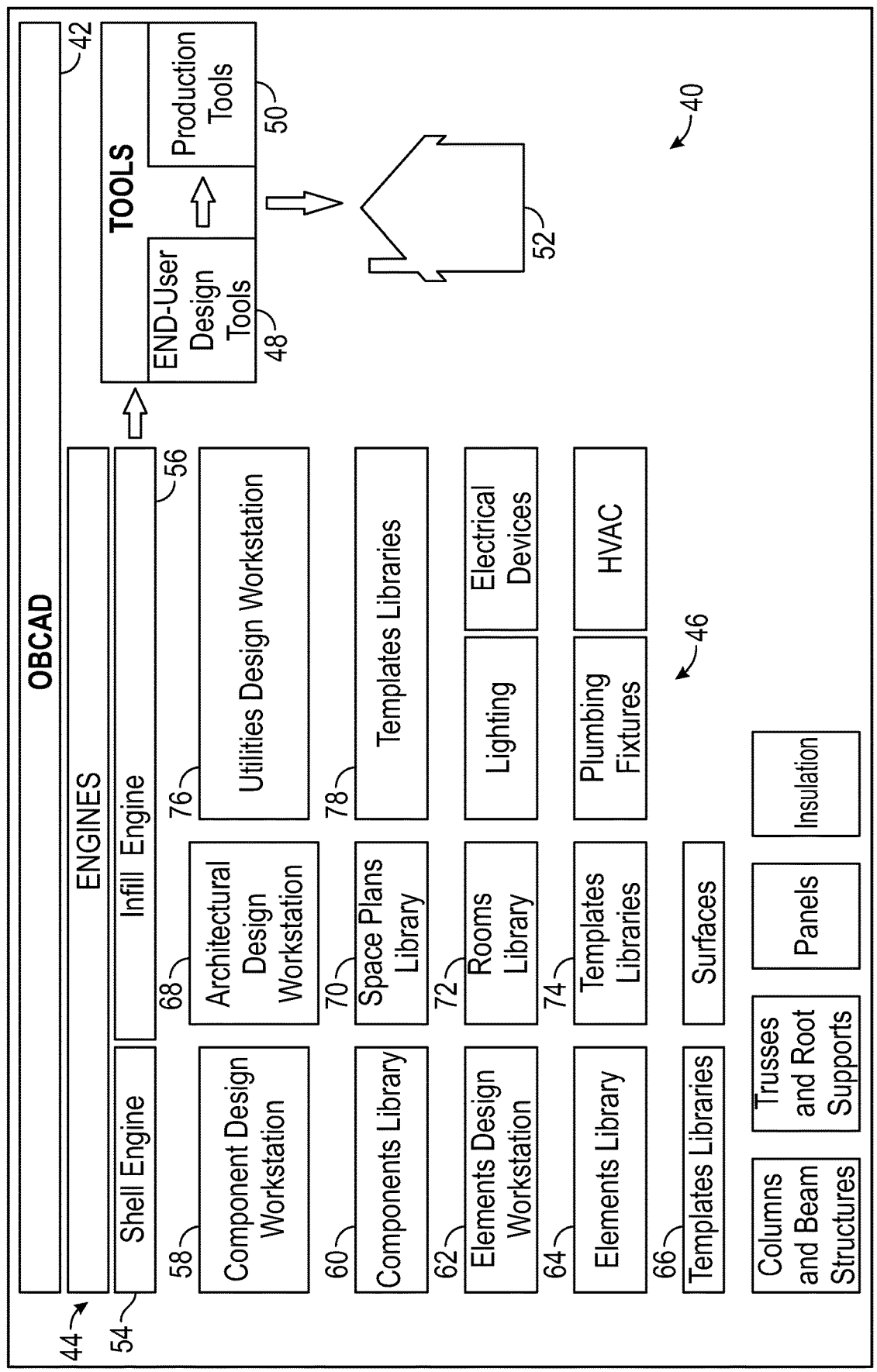
FIG. 2 is a schematic illustration of an example of software architecture of a CAD digital platform, in accordance with one or more embodiments of the present invention.

FIG. 2 depicts an example of a digital platform, all or parts of which may be controlled or executed by the computer system 10 or any other suitable processing device or system, such as a cloud computing node or system. In this example, the platform is configured to facilitate designing buildings and structures, and is referred to herein as an Open Building CAD (OBCAD) platform or system. The OBCAD platform provides design and production tools that allow users (e.g., developers, architects, builders, pre-fabricators, etc.) to design buildings and structures using pre-configured objects and models. The OBCAD platform separately provides templates, objects and models for various building systems, as well as multi-scale CAD environments (grids) based on standardized building product sizes and architectural dimensions, and rules regarding relative positions and orientations of objects and building systems. The OBCAD digital platform shown in FIG. 2 separates the different building systems (e.g., structure, skin, space plan, etc.) from each other such that each can change (both during initial design and in renovation) independently from one another.

In an embodiment, the OBCAD digital platform establishes a multi-scale, 3D grid (based on, e.g., standard building product sizes and architectural/human dimensions) to which all features (e.g., from the front door to a light switch), must adhere in placement and dimensions. Further, embodiments of the OBCAD digital platform can include macro-grids and micro-grids that are compatible with each other such that functionality or physically connected building features are always in an appropriate, compatible location, regardless of where that location is. The grids are the semantics that ensure compatibility between the otherwise disentangled systems.

Referring again to FIG. 2, a schematic illustration of a software architecture 40 of an OBCAD digital platform is generally shown in accordance with one or more embodiments of the present invention. The software architecture 40 includes OBCAD software 42 which includes shell software components 44 (also referred to as "engines") and infill software components 46. As described herein, "shell" components or elements include components or elements that are part of the structure and enclosure of a building (or other structure). Shell components include, but are not limited to, roofs, floors, columns, beams, and exterior walls. "Infill" components or elements include components or elements within the building's structural enclosure. Infill components include, but are not limited to, interior finishes, spatial partitions, plumbing fixtures, HVAC systems, electrical fixtures and other fixtures and components.

The architecture 40 may also include one or more end-user tools, such as end-user design tools 48, and production tools 50. The end-user design tools 48 allow a user (e.g., a homeowner or developer) to design features of a home or other structure to be built. The production tools 50 can be used, for example, by a manufacturer (e.g., builder of conventional home or pre-fabricated home) to facilitate construction of a structure. As shown in FIG. 2, users can utilize shell and infill engines to generate a structure design 52.

In an embodiment, the architecture 40 includes one or more design engines, such as a shell engine 54 and an infill engine 56. Each engine includes design workstations employed, for example, by an implementation expert to design different aspects of a building. A workstation may be a software component of the architecture 40, such as an interface or module that a user can interact with, and may be used at individual client computers (e.g., as physical workstations). Each design workstation can have its own libraries to use as the building blocks of that building aspect. Each engine may also have a template design workstation, used by content creators to populate design workstation libraries with building blocks. Each design workstation may have its own template library or libraries that hold all of the extant building blocks. In embodiments, not all extant building blocks are revealed in the design workstations for all software implementations, for all users, at all times; this is dependent on what the software administrator makes visible to the software user in the design workstations.

The shell engine 54 drives the processing of the shell software components or engines 44, and includes a component design workstation 58, a components library 60, an elements design workstation 62, an elements library 64, and templates libraries 66 (e.g., templates for beam, trusses and roof support, panels, and insulation). The elements library 64 stores OBCAD "elements," which are defined as aggregations of attributes and options. Examples of attributes that can be aggregated into an element include, but are not limited to performance, data, costing, and/or processing information. Examples of options that can be aggregated into an element include, but are not limited to systems, materials and assemblies, and/or positions.

The components library 60 stores OBCAD "components," which are defined as aggregations of elements with parameters and options. Examples of parameters that can be aggregated into a component include, but are not limited to function, positions, variations, and/or impact options. Examples of options that can be aggregated into a component include, but are not limited to configuration, fixture/finish, and/or style.

The infill engine 56 drives the processing of the infill software components 46 (e.g., components related to lighting, electrical devices, plumbing fixtures and HVAC), and includes an architectural design workstation 68 that has a space plans library 70, a rooms library 72, and templates libraries 74. The infill engine 56 also includes a utilities (e.g., mechanical, electrical, & plumbing (MEP) systems) design workstation 76 having templates libraries 78 for MEP systems and/or other internal building components or systems.

It is to be understood that the schematic illustration of FIG. 2 is an example of one embodiment of the digital platform and is not intended to indicate that the software architecture 40 must include all of the components shown in FIG. 2. Rather, the software architecture 40 can include any appropriate fewer or additional components not illustrated in FIG. 2. In addition, the contents of the components can be arranged differently. Furthermore, it is to be understood that the software architecture 40 is provided for illustration purposes and is not intended to be limiting. Embodiments described herein apply to any CAD or other computer-based design or modelling system.

An embodiment of the system 10 and/or the architecture 40 is configured to generate and/or maintain a positioning handle that can be graphically represented within a CAD design space. The design space may be represented by a two-dimensional or three-dimensional coordinate grid. The positioning handle may be a CAD object having pre-selected dimensions and structure. The positioning handle is constructed to be recognizable by a user and to be manipulated by the user in order to position two or more objects relative to one another.

In one embodiment, the positioning handle is configured as a CAD object, which can be represented in any CAD format that allows for representation of three-dimensional objects. The handle may be configured as a mesh object that is constructed from one or more triangles.

In an embodiment, a CAD system (e.g., a system including the architecture 40 or other CAD software architecture) is configured to store data representing a handle in association with each of a plurality of CAD features, such as CAD objects and CAD models. One or more CAD objects may be pre-existing objects having pre-selected dimensions and attributes.

Figure 3:
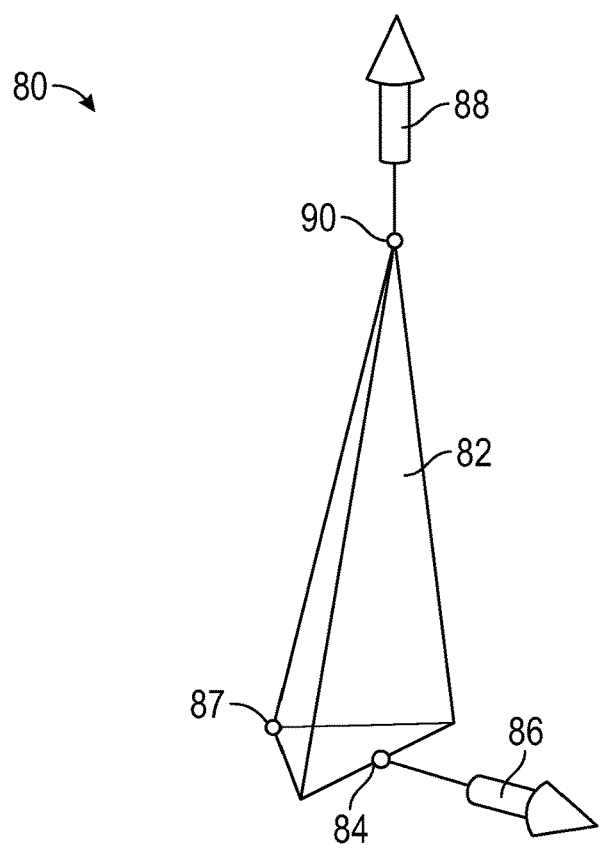
FIG. 3 depicts a digital positioning handle configured to facilitate placement of objects in a CAD environment, in accordance with one or more embodiments of the present invention.

FIG. 3 depicts an example of a positioning handle 80 as represented in a design space, which is configured to be coupled to a CAD object. The positioning handle 80 is configured as a mesh object, which is a three-dimensional object having triangular faces connected by vertices and edges. Data representing the positioning handle 80 may be stored in a CAD file or other data structure representing the CAD object. In this example, the positioning handle 80 is defined as a tetrahedron, having four triangular faces, six straight line segments, and four vertex corners.

The positioning handle 80 is positionally and orientationally fixed relative to the CAD object and a vector space in which the CAD object is located. The handle 80 can be manipulated (by controlling position and orientation) or simply selected to mate with another object handle, referred to as a "target" handle (not shown), in order to align CAD objects with one another according to pre-determined connection or alignment rules. For example, two positioning handles 80 can be selected, and the CAD system extracts the position, orientation and scale of the positioning handles 80, and then constructs a linear transformation to align the positioning handles 80. The linear transformation may include any combination of translation, rotation, scaling and reflection. The same linear transformation is performed on the vector spaces and/or objects associated with the positioning handles 80.

The positioning handle 80 includes a face surface 82 that is configured to mate with a face surface of a target handle. A base point 84 is defined on the face surface 82, and a positioning vector 86 extends from the base point 84. The positioning vector 86 may be orthogonal to the face surface 82 or have a different direction. For example, the positioning vector 86 extends from a back point 87 defined by a vertex opposite the face surface 82. The positioning vector 86 is also referred to as an "OUT vector."

The handle 80 also includes an orientation vector 88, also referred to as an "ORIENT vector." The orientation vector 88 extends from an orient point 90 at the apex of the face surface 82, and has a direction corresponding to the direction of a line connecting the base point and the orient point. It is noted that the positioning handle 80 is not limited to the specific positions and orientations of the vectors, or limited to the specific structure or dimensions shown in FIG. 3.

Figure 4:
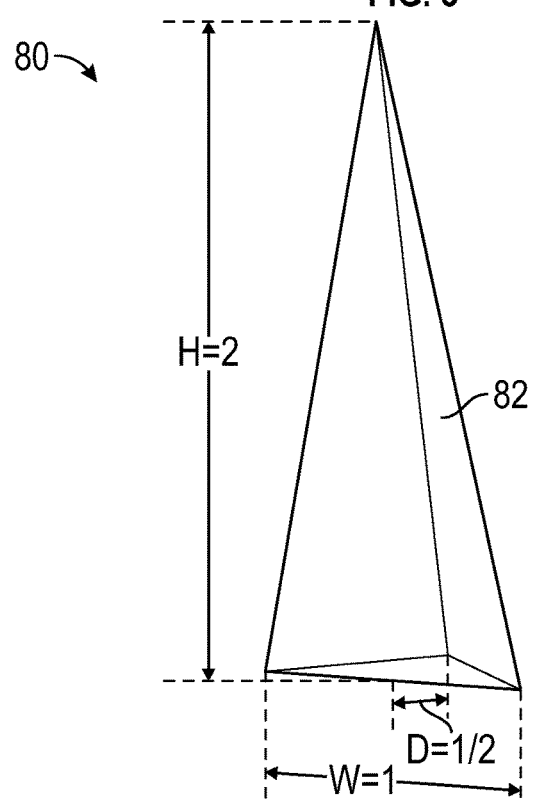
FIG. 4 illustrate an example of dimensions of the positioning handle of FIG. 3.

In one embodiment, the dimensions of the positioning handle 80 are defined in relative terms. This allows the positioning handle 80 to be represented at any scale. For example, as shown in FIG. 4, the width (W) of the positioning handle 80 is defined as one (unitless), the height (H) of the handle 80 is twice that of the width, and the depth (D) is half that of the width.

Figure 5:
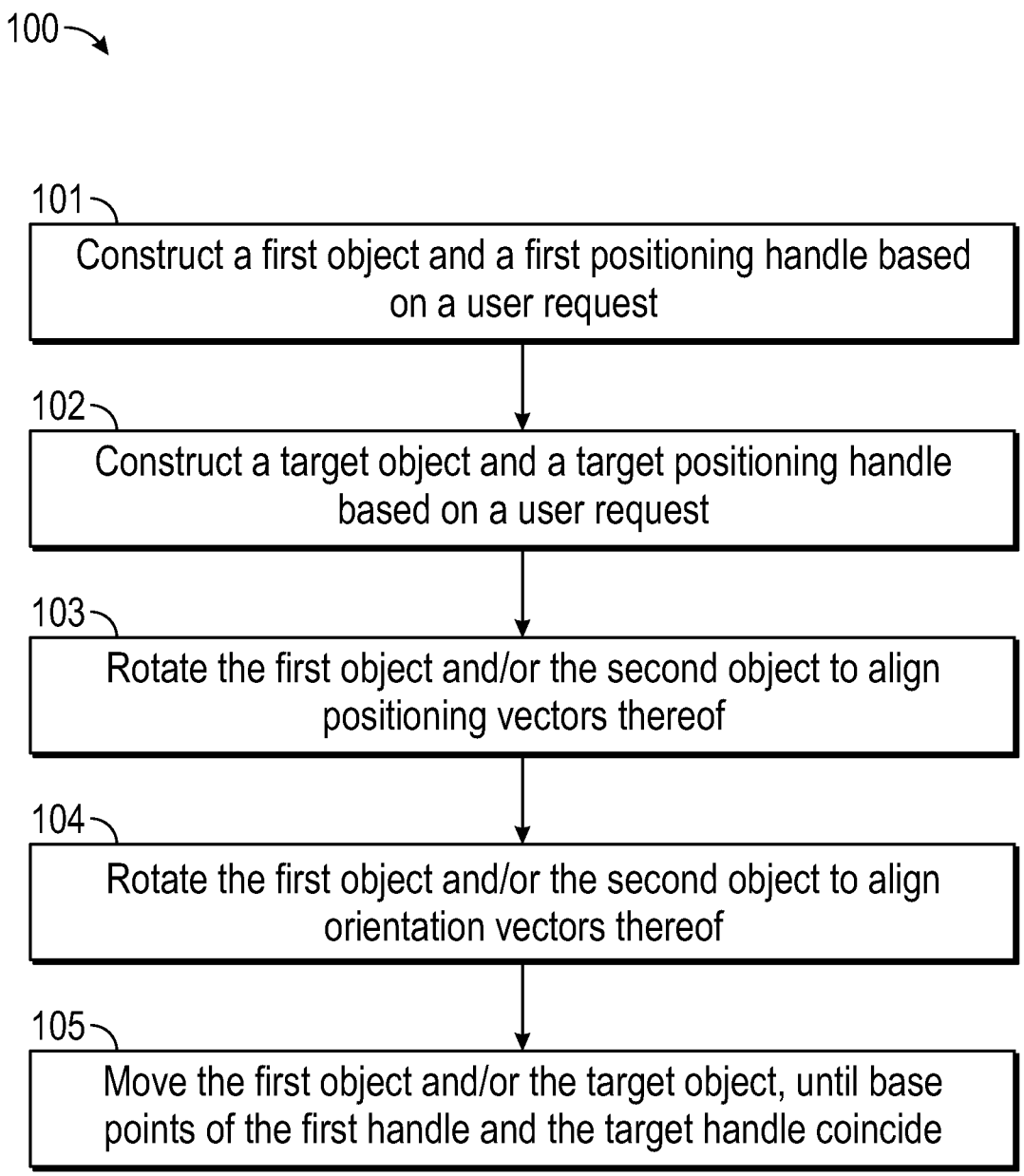
FIG. 5 is a flow diagram illustrating a method of positioning an object in a CAD environment, in accordance with one or more embodiments of the present invention.

FIG. 5 illustrates a computer-implemented method 100 of positioning objects within a design space. The method 100 is implemented by a processing device such as the computer system 10, in conjunction with a suitable software program or architecture such as the OBCAD architecture 40. It is noted that aspects of the method 100 can be performed by any suitably configured processing device or system.

The method 100 includes a plurality of stages or steps represented by blocks 101-105, all of which can be performed sequentially. However, in some embodiments of the invention, one or more of the stages can be performed in a different order than that shown or fewer than the stages shown can be performed.

Figure 6:
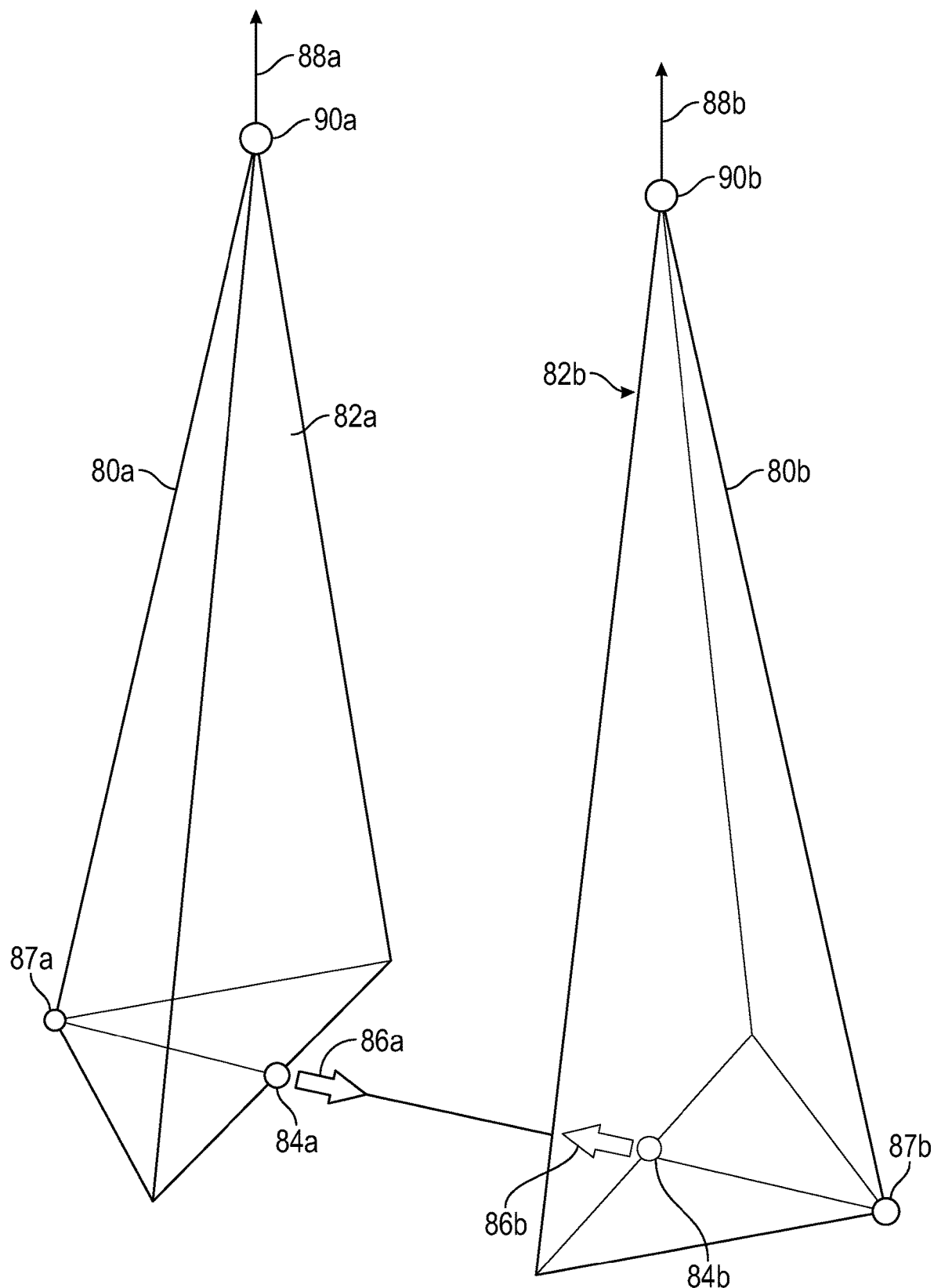
FIG. 6 depicts aspects of an example of a process of mating positioning handles, in accordance with the method of FIG. 5.

The method 100 is discussed in conjunction with an example of two positioning handles shown in FIG. 6. The positioning handles include a first handle 80a and a target handle The handles 80a and 80b are tetrahedra having the same structures and dimensions as the positioning handle 80. In this example, the first handle 80a includes a face surface 82a, a base point 84a, a positioning vector 86a, a back point 87a, an orientation vector 88a and an orient point 90a. Similarly, the target handle 80b includes a face surface 82b, a base point 84b, a positioning vector 86b, a back point 87b, an orientation vector 88b and an orient point 90b.

At block 101, a user selects a first object for display in a CAD design space. The user makes the selection via, for example, an end-user design tool 48 or production tool 50. The processing device acquires the appropriate file, extracts object data, and constructs the first object. The processing device also extracts handle data from file metadata, and constructs the first handle 80a associated with the first object.

At block 102, the user selects a second object, or target object, for display. The target object may be acquired and constructed, or may already be represented within the design space. The user may select the target object by selecting the target handle 80b (e.g., if the target object has more than one handle). The target object is coupled to the target handle 80b.

The user moves the first object via the first handle 80a and/or the target object via the second handle 80b, so that the first handle 80a is proximate to the target handle 80b. The handles 80a and 80b are proximate when, for example, they are within a selected distance from each other.

The following blocks represent manipulations of the objects and handles 80a and 80b to place the handles 80a and 80b in a mating position. The manipulations may be performed by the user, the processing device, or both. For example, the user can manually manipulate the handles until they are mated, or the processing device can computationally perform the manipulations to "snap" or automatically align the handles 80a and 80b into the mating position using a linear transformation, following connection rules of the handles.

For example, the user can select the first object or the first handle 80a. In response, the processing device presents one or more pre-configured target objects. The presentation may take any suitable form, such as a list or display of selectable images. The user then selects a target object for alignment with the first object.

At block 103, the first object and/or the target object are initially scaled (if they have different scales) so that the first object and the second object have the same scale (e.g., the first object is scaled to the second object or vice versa). The first object and/or the second object are then positioned and oriented by the processing device so that the positioning vectors 86a and 86b point in opposing directions. The first object and/or the second object is rotated to align the positioning vectors 86a and 86b. For example, the vector cross product of the first positioning vector 86a and the negation of the target positioning vector 86b is calculated, and the first object is rotated about the vector cross product by an amount that maximizes the angle between the positioning vectors 86a and 86b.

At block 104, the orientation vectors 88a and 88b are aligned so that they point in the same direction. The first object is rotated about the target orientation vector 88b until the angle between the orientation vectors 88a and 88b is minimized.

At block 105, the first handle 80a and the first object are moved until the base points 84a and 84b are coincident. For example, the first object and or the second object are translated along the positioning vectors 86a and 86b.

As a result, the handles 80a and 80b are mated, and the first and second objects are positioned and orientated relative to each other according to the connection rules. The handles 80a and 80b are mated in mirror alignment, in that the face surfaces 82a and 82b are coincident, the orientation vectors 88a and 88b are parallel, and back points 87a and 87b are opposite.

As noted above, the various manipulations of the handles 80a and 80b may be accomplished computationally by constructing a linear transformation. The vector spaces and/or objects are manipulated using the linear transformation so that they are in a desired relationship with one another.

Figure 7:
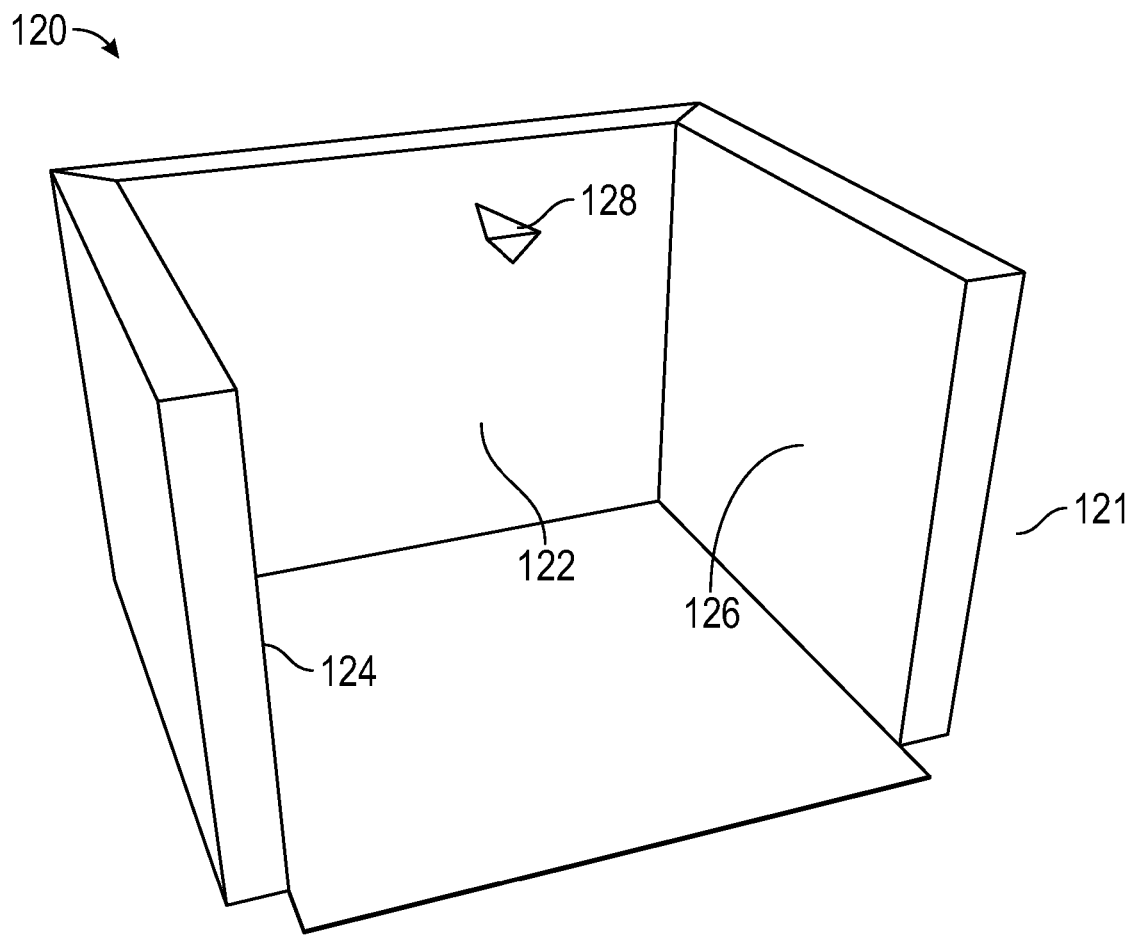
FIG. 7 depicts an example of a first model representing a portion of a building, and a first positioning handle coupled to the first model.
Figure 8:
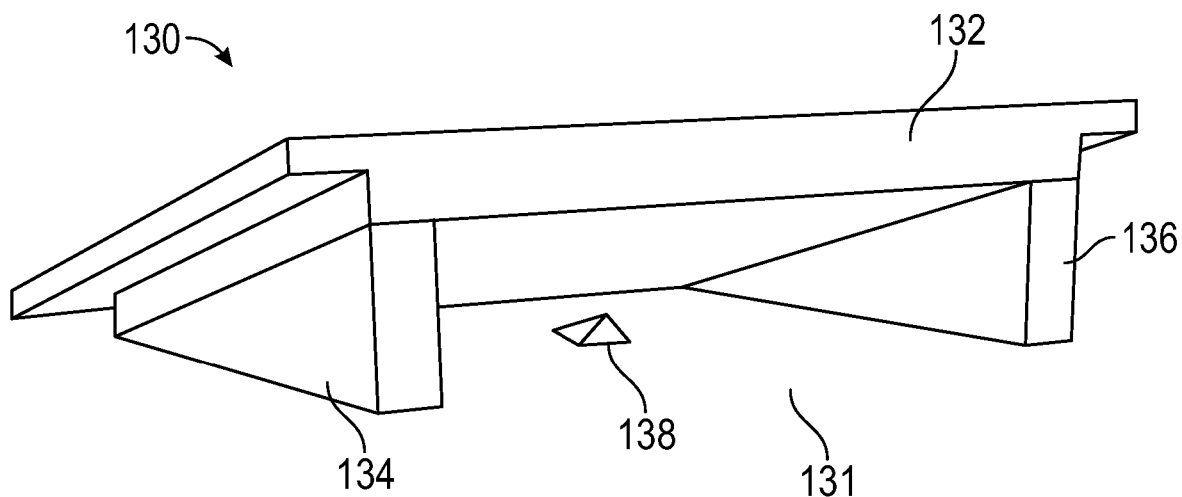
FIG. 8 depicts an example of a second model representing a portion of a roof structure, and a second positioning handle coupled to the second model.
Figure 9:
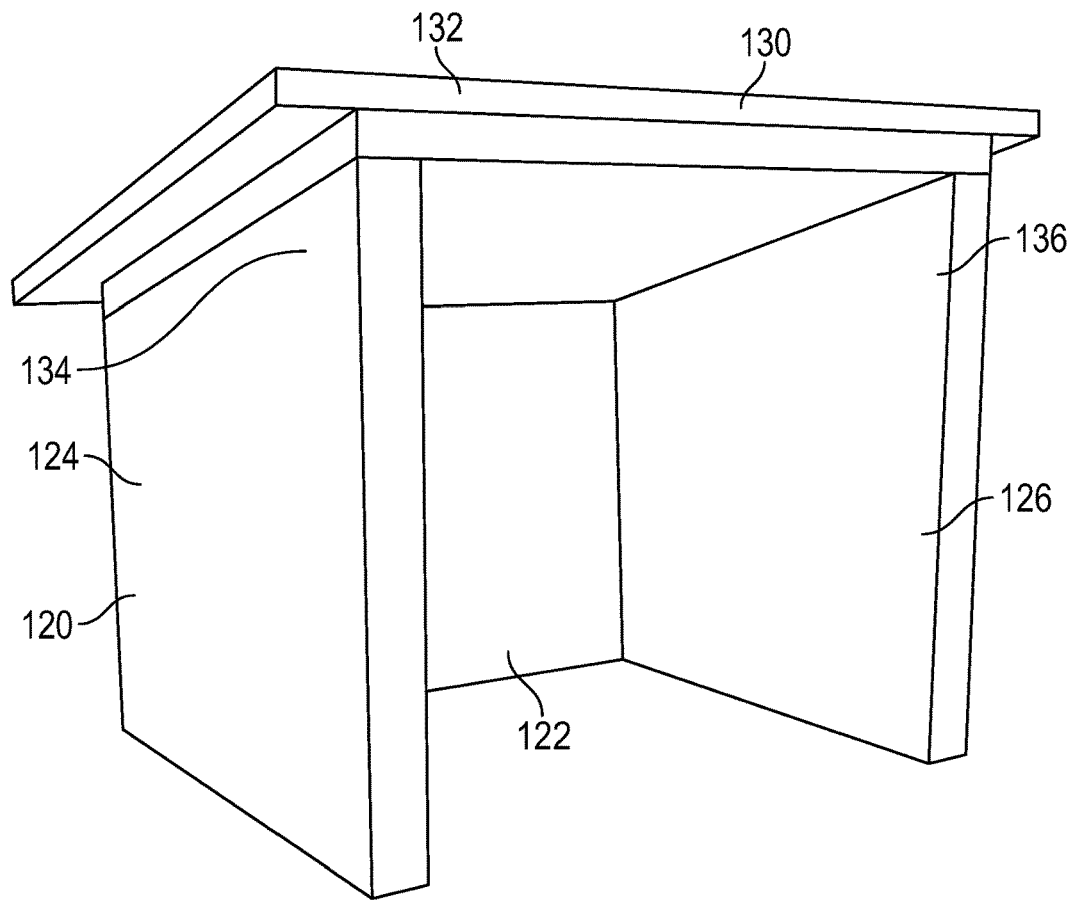
FIG. 9 depicts the first and second models of FIGS. 7 and 8 as aligned according to connection rules of the first and second positioning handles.

FIGS. 7-9 depict an example of positioning handles, and illustrate an example of the method 100 for aligning models in a CAD system (each model may include one or more objects) according to the method 100. In this example, as shown in FIG. 7, a first model 120 is located in a first vector space 121, and represents a building component, such as a room or section of a building, having a rear wall 122, and side walls 124 and 126. The first model 120 also includes a first positioning handle 128 that is coupled to the model 120, i.e., is in a fixed position and orientation relative to the model 120.

The positioning handle 128 defines a facing surface, and a positioning vector that points toward the rear wall 122 in a direction perpendicular to the rear wall 122 and parallel to the side walls 124 and 126. The first positioning handle 128 also defines an orientation vector orthogonal to the facing surface and perpendicular to the positioning vector.

As shown in FIG. 8, a second model 130 is located in a second vector space 131, and represents a roof section of a building having an inclined roof 132 and side portions 134 and 136. The second model 130 includes a second positioning handle 138 that is coupled to the model 130. The second positioning handle 138 defines a facing surface, a positioning vector and an orientation vector. To mate the first model 120 to the second model 130, a user selects each of the models 120 and 130, and the CAD system aligns the models 120 and 130 by mating the first positioning handle 128 to the second positioning handle 138 to align the vector spaces 121 and 131. The aligned models are shown in FIG. 9. The positioning handles assure that the roof 132 is properly positioned above the first model 120 and aligned with the rear wall 122, and that the side walls 124 and 126 are properly positioned on and aligned with the side portions 134 and 136. It is noted that, in this example, the positioning handles 128 and 138 are configured similar to the handles 80a and 80b, in that they each define a tetrahedral structure having a facing surface, and positioning and orientation vectors.

Figure 10:
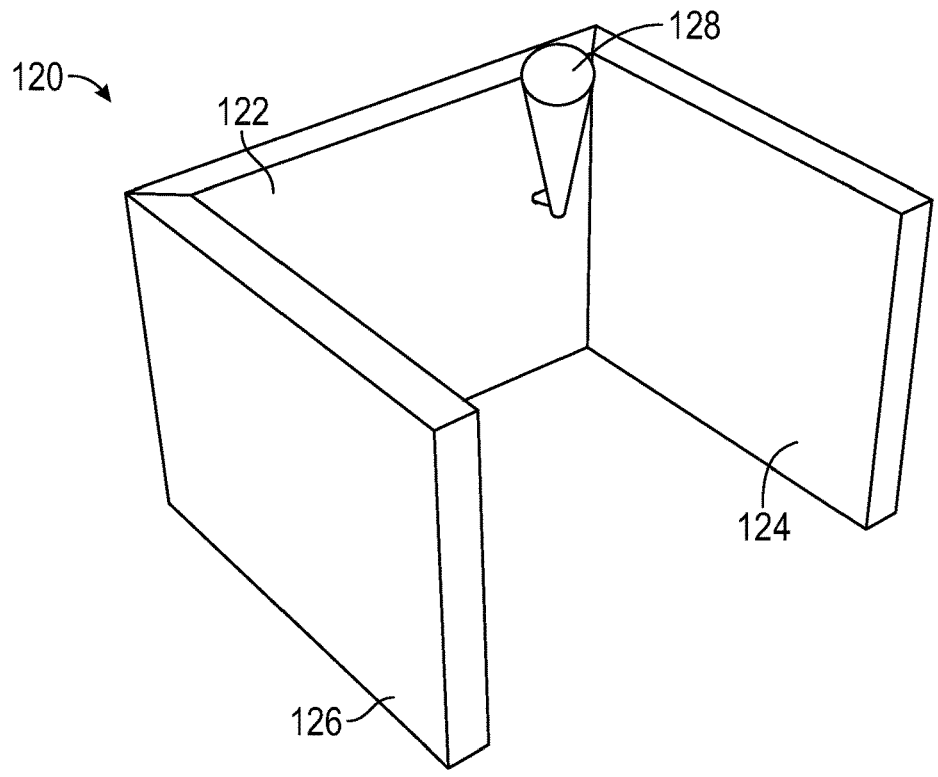
FIG. 10 depicts an alternative representation of the first model of FIG. 7.
Figure 11:
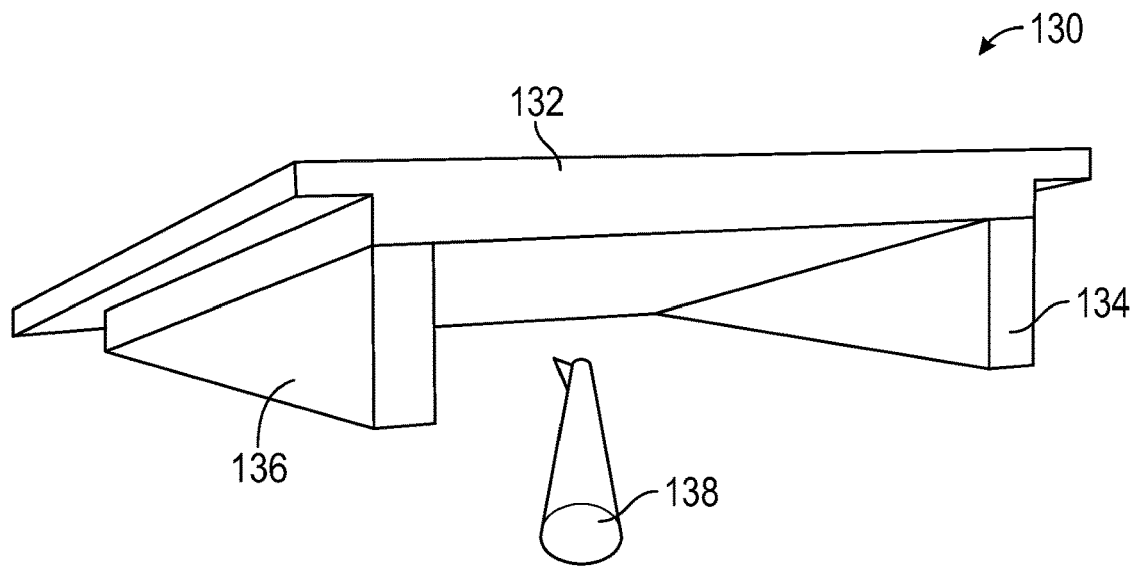
FIG. 11 depicts an alternative representation of the second model of FIG. 8.
Figure 12:
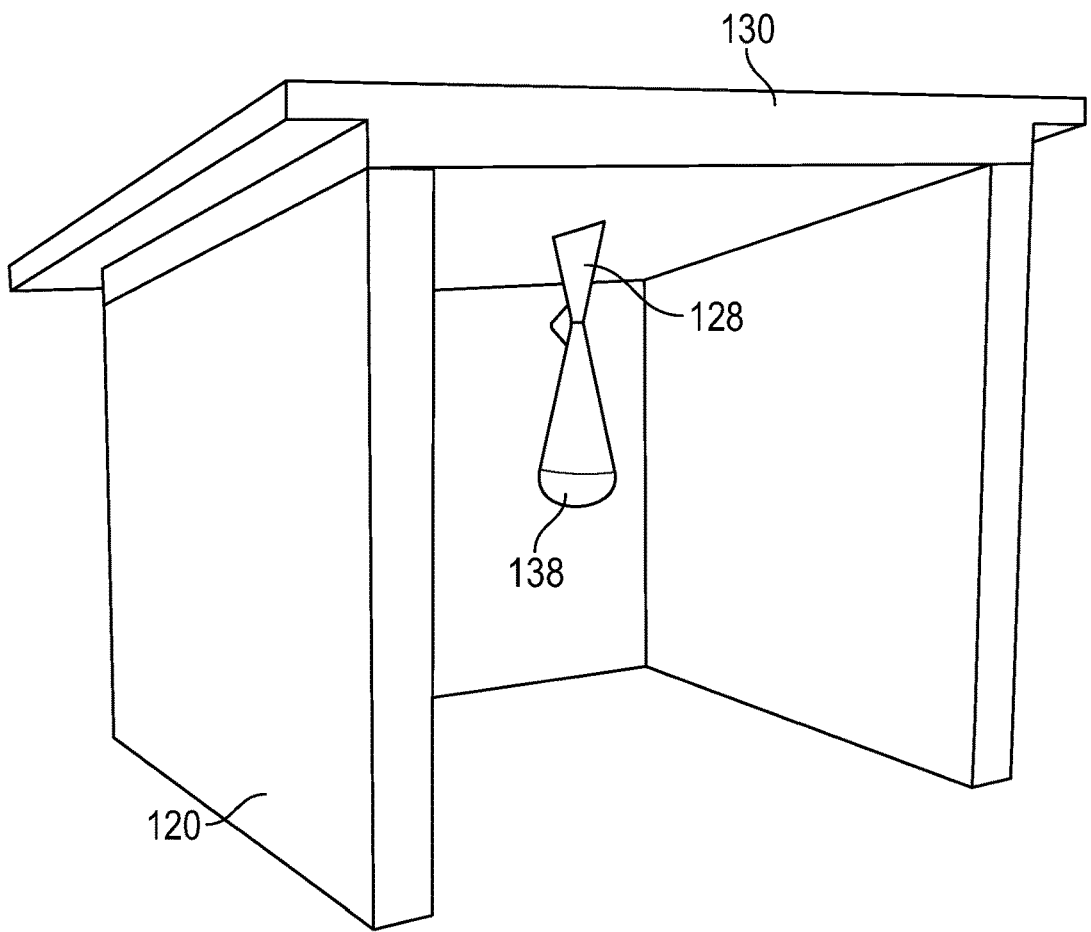
FIG. 12 depicts the first and second models of FIGS. 10 and 11 as aligned using respective positioning handles.

An alternative representation of the models and handles is shown in FIGS. 10-12, which may be used by a programmer to set positioning handles. In this example, the positioning handles 128 and 138 are represented by simplified conical shapes that can be added and manipulated by the programmer to set connection rules. FIG. 10 shows the first model 120 and the first positing handle 128, FIG. 11 shows the second model 130 and the second positioning handle 138, and FIG. 12 shows the first and second models aligned with the positioning handles mated together. This example is for illustrative purposes, as the embodiments described herein may utilize any of various interfaces and representations of objects, models and positioning handles.

It is understood in advance that although this disclosure describes a digital platform for a design and build process in reference to cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. In essence, cloud computing is an infrastructure made up of a network of interconnected nodes.

Figure 13:
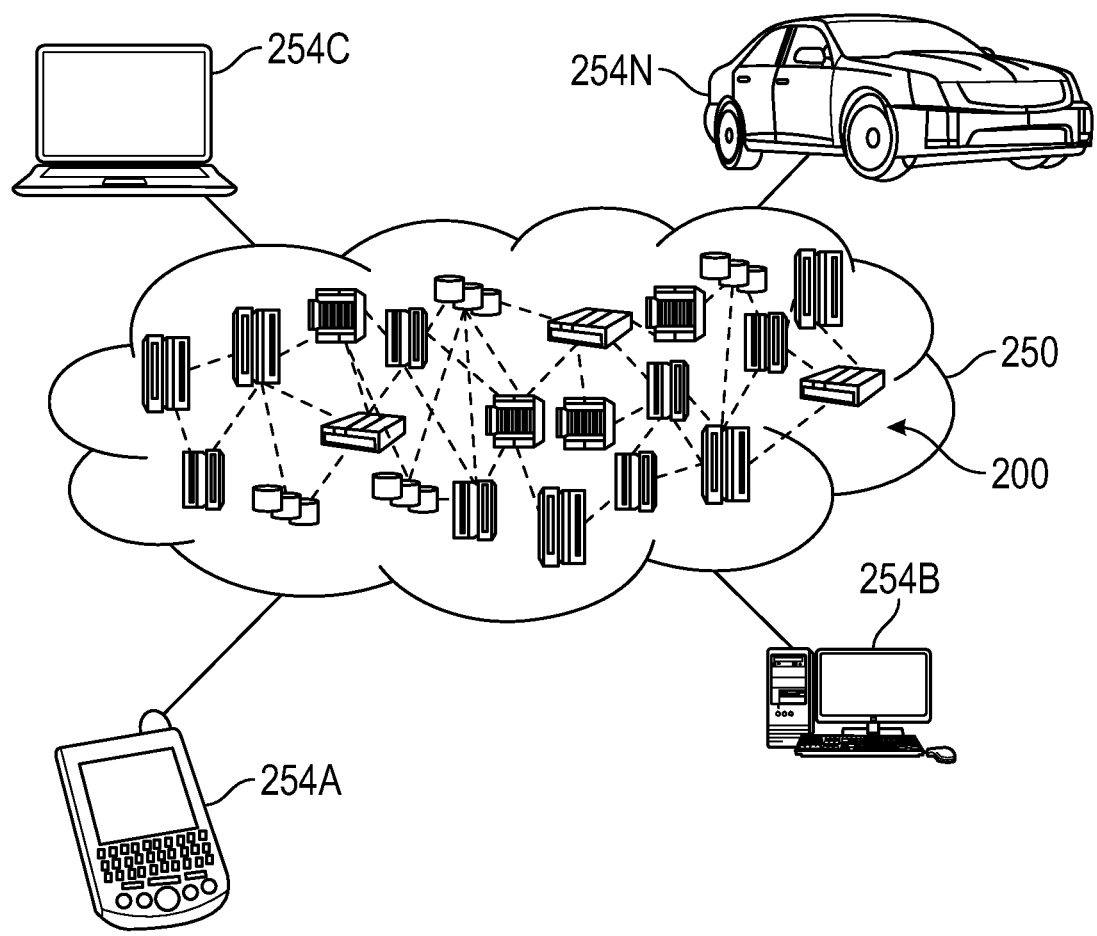
FIG. 13 depicts a cloud computing environment, in accordance with some embodiments of the present disclosure.

Referring now to FIG. 13, an illustrative cloud computing environment 250 is depicted. As shown, the cloud computing environment comprises one or more cloud computing nodes 200 with which local computing devices 254 used by cloud consumers, such as, for example, laptop device 254C, smartphone 254A and personal computer 254B may communicate. Nodes 200 may communicate with one another. They may be grouped (not shown) physically or virtually, in one or more networks, such as Private, Community, Public, or Hybrid clouds as described hereinabove, or a combination thereof. This allows cloud computing environment to offer infrastructure, platforms and/or software as services for which a cloud consumer does not need to maintain resources on a local computing device. It is understood that the types of computing devices 254 shown in FIG. 13 are intended to be illustrative only and that computing nodes 200 and the cloud computing environment shown in FIG. 13 can communicate with any type of computerized device over any type of network and/or network addressable connection (e.g., using a web browser).

Figure 14:
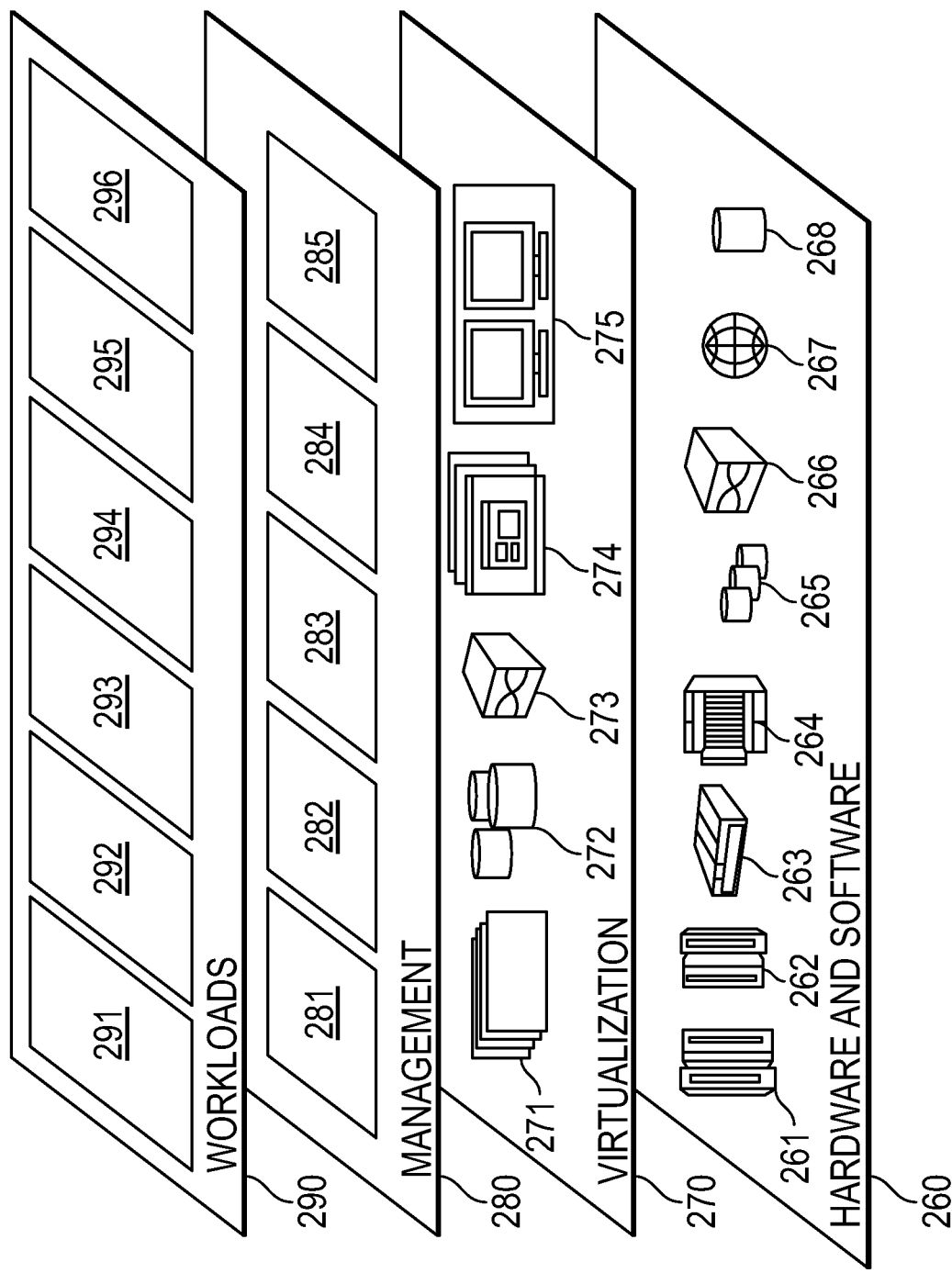
FIG. 14 depicts abstraction model layers, in accordance with some embodiments of the present disclosure.

Referring now to FIG. 14, a set of functional abstraction layers provided by the cloud computing environment of FIG. 13 is shown. It should be understood in advance that the components, layers, and functions shown in FIG. 14 are intended to be illustrative only and embodiments of the invention are not limited thereto. As depicted, the following layers and corresponding functions are provided: hardware and software layer 260 includes hardware and software components. Examples of hardware components include mainframes 261; RISC (Reduced Instruction Set Computer) architecture based servers 262; servers 263; blade servers 264; storage devices 265; and networks and networking components 266. In some embodiments, software components include network application server software 267 and database software 268; virtualization layer 270 provides an abstraction layer from which the following examples of virtual entities may be provided: virtual servers 271; virtual storage 272; virtual networks 273, including virtual private networks; virtual applications and operating systems 274; and virtual clients 275.

In one example, management layer 280 may provide the functions described below. Resource provisioning 281 provides dynamic procurement of computing resources and other resources that are utilized to perform tasks within the cloud computing environment. Metering and pricing 282 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 283 provides access to the cloud computing environment for consumers and system administrators. Service level management 284 provides cloud computing resource allocation and management such that required service levels are met. Service Level Agreement (SLA) planning and fulfillment 285 provides pre-arrangement for, and procurement of, cloud computing resources for which a future requirement is anticipated in accordance with an SLA.

Workloads layer 290 provides examples of functionality for which the cloud computing environment may be utilized. Examples of workloads and functions which may be provided from this layer include: mapping and navigation 291; software development and lifecycle management 292; virtual classroom dedication delivery 293; data analytics processing 294; transaction processing 295; and design and build digital platforms 296.

The following are some embodiments of the foregoing disclosure:

Embodiment 1: A method of positioning features in a digital design space, comprising: receiving a request from a user to place a first feature in the design space; based on the request, placing the first feature in the design space, and coupling a first positioning handle to the first feature in the design space, the first positioning handle graphically represented in the design space and manipulatable by the user, the first positioning handle having a fixed position and fixed orientation relative to the first feature, the first positioning handle including a first face surface and defining a first vector; and moving the first feature into a pre-determined position and orientation relative to a target feature in the design space by mating the first positioning handle to a target positioning handle coupled to the target feature.

Embodiment 2: The method of any previous embodiment, wherein the first positioning handle is fixedly positioned and oriented relative to the first feature, and the target positioning handle is fixedly positioned and oriented relative to the second feature, so that when the first handle and the target handle are mated, the first feature is in the pre-determined position and orientation.

Embodiment 3: The method of any previous embodiment, wherein the target positioning handle includes a target face surface and a target vector, and moving the first feature includes manipulating the first feature or the second feature until the first face surface is coincident with the target face surface and the first vector is in alignment with the target vector.

Embodiment 4: The method of any previous embodiment, wherein the design space is a computer-aided design (CAD) space.

Embodiment 5: The method of any previous embodiment, wherein the first positioning handle and the target positioning handle are three-dimensional mesh objects.

Embodiment 6: The method of any previous embodiment, wherein the first positioning handle includes the first face surface and a first base point on the first face surface, the first vector includes a first positioning vector extending from the first base point, and the first vector includes a first orientation vector.

Embodiment 7: The method of any previous embodiment, wherein the target positioning handle includes a target face surface, a target base point on the target face surface, a target positioning vector extending from the target base point, and the target vector includes a target orientation vector.

Embodiment 8: The method of any previous embodiment, wherein mating the first positioning handle to the target positioning handle includes moving and orienting the first positioning handle and/or the second positioning handle so that: the first base point is coincident with the target base point; an angle between the first positioning vector and the target positioning vector is maximized; and an angle between the first orientation vector and the target orientation vector is minimized.

Embodiment 9: The method of any previous embodiment, wherein the first positioning handle includes a plurality of dimensions, the plurality of dimensions being defined relative to one another.

Embodiment 10: The method of any previous embodiment, wherein object data representing the first object is stored in an object file, and handle data representing the positioning handle is stored in metadata within the object file.

Embodiment 11: A system for positioning objects in a digital design space, comprising: one or more processors for executing computer readable instructions, the computer readable instructions controlling the one or more processors to perform operations comprising: receiving a request from a user to place a first feature in the design space; based on the request, placing the first feature in the design space, and coupling a first positioning handle to the first feature in the design space, the first positioning handle graphically represented in the design space and manipulatable by the user, the first positioning handle having a fixed position and fixed orientation relative to the first feature, the first positioning handle including a first face surface and defining a first vector; and moving the first feature into a pre-determined position and orientation relative to a target feature in the design space by mating the first positioning handle to a target positioning handle coupled to the target feature.

Embodiment 12: The system of any previous embodiment, wherein the first positioning handle is fixedly positioned and oriented relative to the first feature, and the target positioning handle is fixedly positioned and oriented relative to the second feature, so that when the first handle and the target handle are mated, the first feature is in the pre-determined position and orientation.

Embodiment 13: The system of any previous embodiment, wherein the target positioning handle includes a target face surface and a target vector, and moving the first feature includes manipulating the first feature or the second feature until the first face surface is coincident with the target face surface and the first vector is in alignment with the target vector.

Embodiment 14: The system of any previous embodiment, wherein the design space is a computer-aided design (CAD) space.

Embodiment 15: The system of any previous embodiment, wherein the first positioning handle and the target positioning handle are three-dimensional mesh objects.

Embodiment 16: The system of any previous embodiment, wherein the first positioning handle includes the first face surface and a first base point on the first face surface, the first vector includes a first positioning vector extending from the first base point, and the first vector includes a first orientation vector.

Embodiment 17: The system of any previous embodiment, wherein the target positioning handle includes a target face surface, a target base point on the target face surface, a target positioning vector extending from the target base point, and the target vector includes a target orientation vector.

Embodiment 18: The system of any previous embodiment, wherein mating the first positioning handle to the target positioning handle includes moving and orienting the first positioning handle and/or the second positioning handle so that: the first base point is coincident with the target base point; an angle between the first positioning vector and the target positioning vector is maximized; and an angle between the first orientation vector and the target orientation vector is minimized.

Embodiment 19: The system of any previous embodiment, wherein the first positioning handle includes a plurality of dimensions, the plurality of dimensions being defined relative to one another.

Embodiment 20: The system of any previous embodiment, wherein object data representing the first object is stored in an object file, and handle data representing the positioning handle is stored in metadata within the object file.

It will be appreciated that aspects of the present invention may be embodied as a system, method, or computer program product and may take the form of a hardware embodiment, a software embodiment (including firmware, resident software, micro-code, etc.), or a combination thereof. Furthermore, aspects of the present invention may take the form of a computer program product embodied in one or more computer readable medium(s) having computer readable program code embodied thereon.

One or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In one aspect, the computer readable storage medium may be a tangible medium containing or storing a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

The computer readable medium may contain program code embodied thereon, which may be transmitted using any appropriate medium, including but not limited to wireless, wireline, optical fiber cable, RF, etc., or any suitable combination of the foregoing. In addition, computer program code for carrying out operations for implementing aspects of the present invention may be written in any combination of one or more programming languages, including an object oriented programming language such as Java, C# or the like, an interpretive programming language, a functional programming language and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server.

It will be appreciated that aspects of the present invention are described herein with reference to flowchart illustrations and/or block diagrams of methods, apparatus (systems) and computer program products according to embodiments of the invention. It will be understood that each block or step of the flowchart illustrations and/or block diagrams, and combinations of blocks or steps in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In addition, some embodiments described herein are associated with an "indication". As used herein, the term "indication" may be used to refer to any indicia and/or other information indicative of or associated with a subject, item, entity, and/or other object and/or idea. As used herein, the phrases "information indicative of" and "indicia" may be used to refer to any information that represents, describes, and/or is otherwise associated with a related entity, subject, or object. Indicia of information may include, for example, a code, a reference, a link, a signal, an identifier, and/or any combination thereof and/or any other informative representation associated with the information. In some embodiments, indicia of information (or indicative of the information) may be or include the information itself and/or any portion or component of the information. In some embodiments, an indication may include a request, a solicitation, a broadcast, and/or any other form of information gathering and/or dissemination.

Numerous embodiments are described in this patent application, and are presented for illustrative purposes only. The described embodiments are not, and are not intended to be, limiting in any sense. The presently disclosed invention(s) are widely applicable to numerous embodiments, as is readily apparent from the disclosure. One of ordinary skill in the art will recognize that the disclosed invention(s) may be practiced with various modifications and alterations, such as structural, logical, software, and electrical modifications. Although particular features of the disclosed invention(s) may be described with reference to one or more particular embodiments and/or drawings, it should be understood that such features are not limited to usage in the one or more particular embodiments or drawings with reference to which they are described, unless expressly specified otherwise.

Devices that are in communication with each other need not be in continuous communication with each other, unless expressly specified otherwise. On the contrary, such devices need only transmit to each other as necessary or desirable, and may actually refrain from exchanging data most of the time. For example, a machine in communication with another machine via the Internet may not transmit data to the other machine for weeks at a time. In addition, devices that are in communication with each other may communicate directly or indirectly through one or more intermediaries.

A description of an embodiment with several components or features does not imply that all or even any of such components and/or features are required. On the contrary, a variety of optional components are described to illustrate the wide variety of possible embodiments of the present invention(s). Unless otherwise specified explicitly, no component and/or feature is essential or required.

Further, although process steps, algorithms or the like may be described in a sequential order, such processes may be configured to work in different orders. In other words, any sequence or order of steps that may be explicitly described does not necessarily indicate a requirement that the steps be performed in that order. The steps of processes described herein may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the invention, and does not imply that the illustrated process is preferred.

"Determining" something can be performed in a variety of manners and therefore the term "determining" (and like terms) includes calculating, computing, deriving, looking up (e.g., in a table, database or data structure), ascertaining and the like.

It will be readily apparent that the various methods and algorithms described herein may be implemented by, e.g., appropriately and/or specially-programmed general purpose computers and/or computing devices. Typically, a processor (e.g., one or more microprocessors) will receive instructions from a memory or like device, and execute those instructions, thereby performing one or more processes defined by those instructions. Further, programs that implement such methods and algorithms may be stored and transmitted using a variety of media (e.g., computer readable media) in a number of manners. In some embodiments, hard-wired circuitry or custom hardware may be used in place of, or in combination with, software instructions for implementation of the processes of various embodiments. Thus, embodiments are not limited to any specific combination of hardware and software.

A "processor" generally means any one or more microprocessors, CPU devices, GPU devices, computing devices, microcontrollers, digital signal processors, or like devices, as further described herein. A CPU typically performs a variety of tasks while a GPU is optimized to display images.

Where databases are described, it will be understood by one of ordinary skill in the art that (i) alternative database structures to those described may be readily employed, and (ii) other memory structures besides databases may be readily employed. Any illustrations or descriptions of any sample databases presented herein are illustrative arrangements for stored representations of information. Any number of other arrangements may be employed besides those suggested by, e.g., tables illustrated in drawings or elsewhere. Similarly, any illustrated entries of the databases represent exemplary information only; one of ordinary skill in the art will understand that the number and content of the entries can be different from those described herein. Further, despite any depiction of the databases as tables, other formats (including relational databases, object-based models and/or distributed databases) could be used to store and manipulate the data types described herein. Likewise, object methods or behaviors of a database can be used to implement various processes, such as the described herein. In addition, the databases may, in a known manner, be stored locally or remotely from a device that accesses data in such a database.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

Terms such as processor, controller, computer, DSP, FPGA are understood in this document to mean a computing device that may be located within an instrument, distributed in multiple elements throughout an instrument, or placed external to an instrument.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The term "about" is intended to include the degree of error associated with measurement of the particular quantity based upon the equipment available at the time of filing the application. For example, "about" can include a range of ±8% or 5%, or 2% of a given value.

What is claimed is:

1. A method of positioning features in a digital design space, comprising:
   receiving a request from a user to place a first feature in the design space;
   based on the request, placing the first feature in the design space, and coupling a first positioning handle to the first feature in the design space, the first positioning handle graphically represented in the design space and manipulatable by the user, the first positioning handle having a fixed position and fixed orientation relative to the first feature, the first positioning handle including a first face surface and defining a first vector; and
   moving the first feature into a pre-determined position and orientation relative to a target feature in the design space by mating the first positioning handle to a target positioning handle coupled to the target feature.

2. The method of claim 1, wherein the first positioning handle is fixedly positioned and oriented relative to the first feature, and the target positioning handle is fixedly positioned and oriented relative to the second feature, so that when the first handle and the target handle are mated, the first feature is in the pre-determined position and orientation.

3. The method of claim 1, wherein the target positioning handle includes a target face surface and a target vector, and moving the first feature includes manipulating the first feature or the second feature until the first face surface is coincident with the target face surface and the first vector is in alignment with the target vector.

4. The method of claim 1, wherein the design space is a computer-aided design (CAD) space.

5. The method of claim 4, wherein the first positioning handle and the target positioning handle are three-dimensional mesh objects.

6. The method of claim 5, wherein the first positioning handle includes the first face surface and a first base point on the first face surface, the first vector includes a first positioning vector extending from the first base point, and the first vector includes a first orientation vector.

7. The method of claim 6, wherein the target positioning handle includes a target face surface, a target base point on the target face surface, a target positioning vector extending from the target base point, and the target vector includes a target orientation vector.

8. The method of claim 7, wherein mating the first positioning handle to the target positioning handle includes moving and orienting the first positioning handle and/or the second positioning handle so that:
the first base point is coincident with the target base point;
an angle between the first positioning vector and the target positioning vector is maximized; and
an angle between the first orientation vector and the target orientation vector is minimized.

9. The method of claim 1, wherein the first positioning handle includes a plurality of dimensions, the plurality of dimensions being defined relative to one another.

10. The method of claim 1, wherein object data representing the first object is stored in an object file, and handle data representing the positioning handle is stored in metadata within the object file.

11. A system for positioning objects in a digital design space, comprising:
one or more processors for executing computer readable instructions, the computer readable instructions controlling the one or more processors to perform operations comprising:
receiving a request from a user to place a first feature in the design space;
based on the request, placing the first feature in the design space, and coupling a first positioning handle to the first feature in the design space, the first positioning handle graphically represented in the design space and manipulatable by the user, the first positioning handle having a fixed position and fixed orientation relative to the first feature, the first positioning handle including a first face surface and defining a first vector; and
moving the first feature into a pre-determined position and orientation relative to a target feature in the design space by mating the first positioning handle to a target positioning handle coupled to the target feature.

12. The system of claim 11, wherein the first positioning handle is fixedly positioned and oriented relative to the first feature, and the target positioning handle is fixedly positioned and oriented relative to the second feature, so that when the first handle and the target handle are mated, the first feature is in the pre-determined position and orientation.

13. The system of claim 11, wherein the target positioning handle includes a target face surface and a target vector, and moving the first feature includes manipulating the first feature or the second feature until the first face surface is coincident with the target face surface and the first vector is in alignment with the target vector.

14. The system of claim 11, wherein the design space is a computer-aided design (CAD) space.

15. The system of claim 14, wherein the first positioning handle and the target positioning handle are three-dimensional mesh objects.

16. The system of claim 15, wherein the first positioning handle includes the first face surface and a first base point on the first face surface, the first vector includes a first positioning vector extending from the first base point, and the first vector includes a first orientation vector.

17. The system of claim 16, wherein the target positioning handle includes a target face surface, a target base point on the target face surface, a target positioning vector extending from the target base point, and the target vector includes a target orientation vector.

18. The system of claim 17, wherein mating the first positioning handle to the target positioning handle includes moving and orienting the first positioning handle and/or the second positioning handle so that:
the first base point is coincident with the target base point;
an angle between the first positioning vector and the target positioning vector is maximized; and
an angle between the first orientation vector and the target orientation vector is minimized.

19. The system of claim 11, wherein the first positioning handle includes a plurality of dimensions, the plurality of dimensions being defined relative to one another.

20. The system of claim 11, wherein object data representing the first object is stored in an object file, and handle data representing the positioning handle is stored in metadata within the object file.

* * * * *